(12) United States Patent
Honda

(10) Patent No.: US 9,768,738 B2
(45) Date of Patent: Sep. 19, 2017

(54) POWER AMPLIFICATION CIRCUIT

(71) Applicant: Murata Manufacturing Co., Ltd., Kyoto (JP)

(72) Inventor: Yuri Honda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/268,815

(22) Filed: Sep. 19, 2016

(65) Prior Publication Data

US 2017/0126183 A1 May 4, 2017

(30) Foreign Application Priority Data

Nov. 2, 2015 (JP) ................................. 2015-215771

(51) Int. Cl.
| | | |
|---|---|---|
| H03F 3/04 | (2006.01) | |
| H03F 1/32 | (2006.01) | |
| H03F 3/19 | (2006.01) | |
| H03F 3/21 | (2006.01) | |

(52) U.S. Cl.
CPC ................ *H03F 1/32* (2013.01); *H03F 3/19* (2013.01); *H03F 3/21* (2013.01); *H03F 2200/411* (2013.01); *H03F 2200/451* (2013.01); *H03F 2200/555* (2013.01)

(58) Field of Classification Search
CPC ................ H03F 3/04; H03F 3/20; H03G 3/30
USPC ................................................. 330/296, 285
See application file for complete search history.

(56) References Cited

U.S. PATENT DOCUMENTS

| | | | | |
|---|---|---|---|---|
| 8,106,712 B2* | 1/2012 | Lee | ....................... | H03F 1/0261 330/285 |
| 8,138,836 B2* | 3/2012 | Matsuzuka | ............... | H03F 3/16 330/285 |
| 8,373,509 B2* | 2/2013 | Zeng | ..................... | H03F 1/0205 330/296 |
| 8,692,619 B2* | 4/2014 | Wakita | .................. | H03F 1/0261 330/289 |
| 8,791,760 B2* | 7/2014 | Nadimpalli | ........... | H03F 1/0266 330/285 |
| 8,847,686 B2* | 9/2014 | Ding | ....................... | H03F 1/302 330/289 |
| 8,854,142 B2* | 10/2014 | Iizuka | ....................... | H03F 1/30 330/285 |
| 2011/0006846 A1 | 1/2011 | Miho et al. | | |

FOREIGN PATENT DOCUMENTS

WO 2009/125555 A1 10/2009

* cited by examiner

*Primary Examiner* — Henry Choe
(74) *Attorney, Agent, or Firm* — Pearne & Gordon LLP

(57) ABSTRACT

A power amplification circuit includes: a first output transistor that has a power supply voltage supplied to its collector or drain, has a common emitter or source, amplifies an input signal supplied to its base or gate and outputs a first amplified signal from its collector or drain; a first transistor that has the power supply voltage supplied to its collector or drain, has a first current supplied to its base or gate and supplies a first bias current to the base or gate of the first output transistor from its emitter or source; and a second transistor that has its collector or drain connected to the base or gate of the first transistor, has a second current supplied to its base or gate and supplies a second bias current to the base or gate of the first output transistor from its emitter or source.

21 Claims, 20 Drawing Sheets

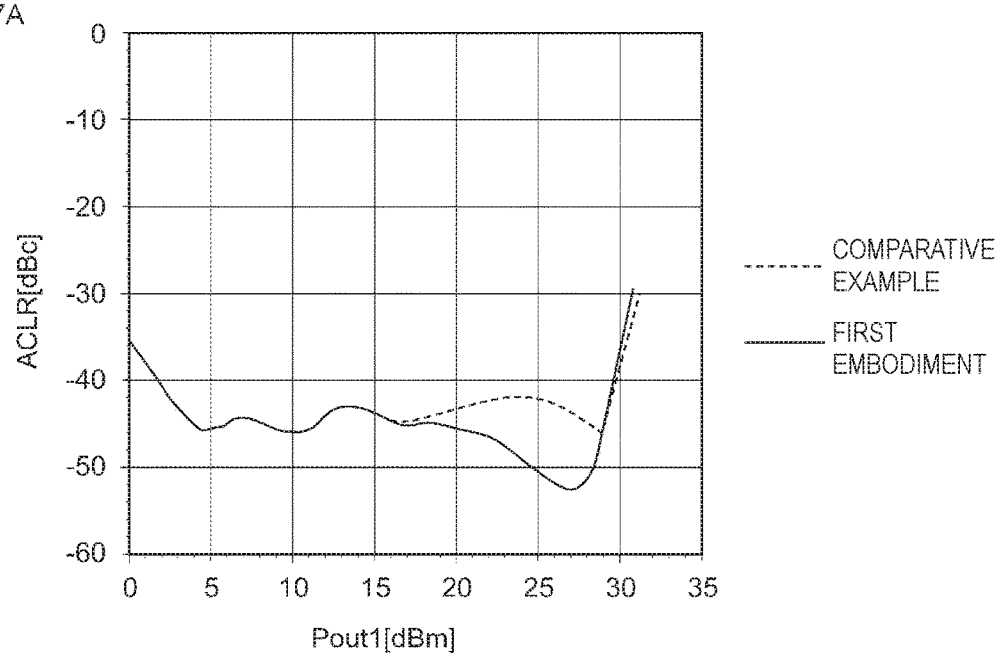

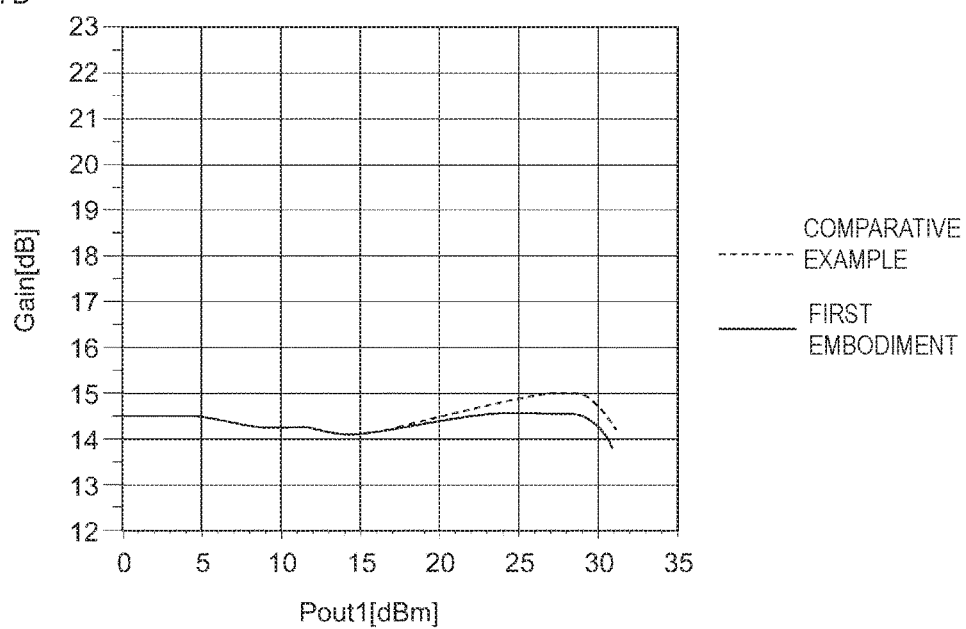

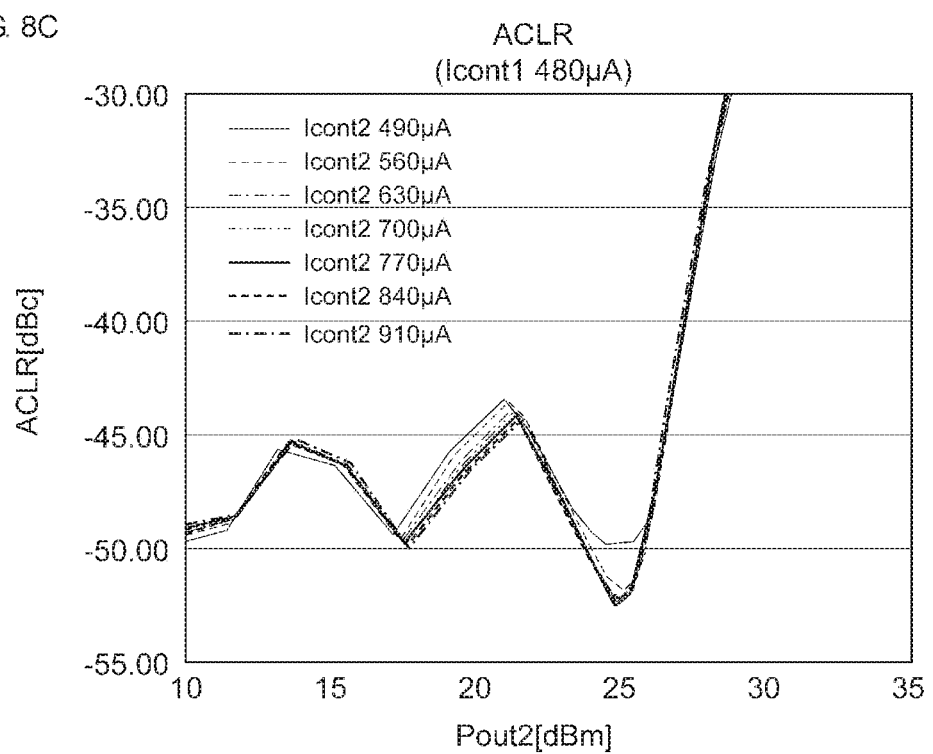

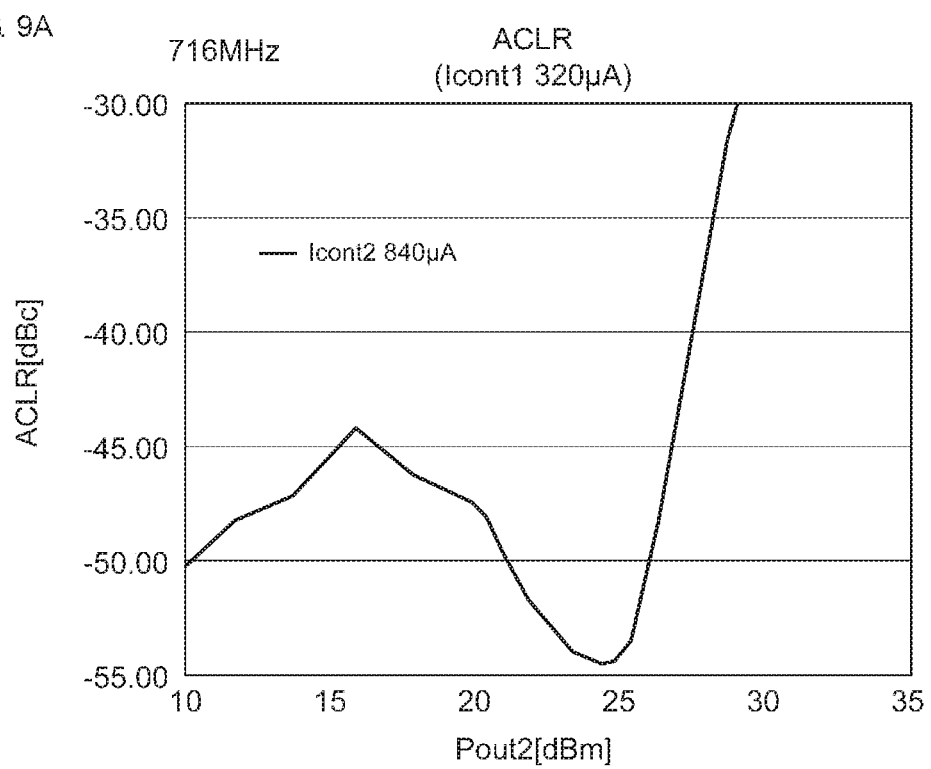

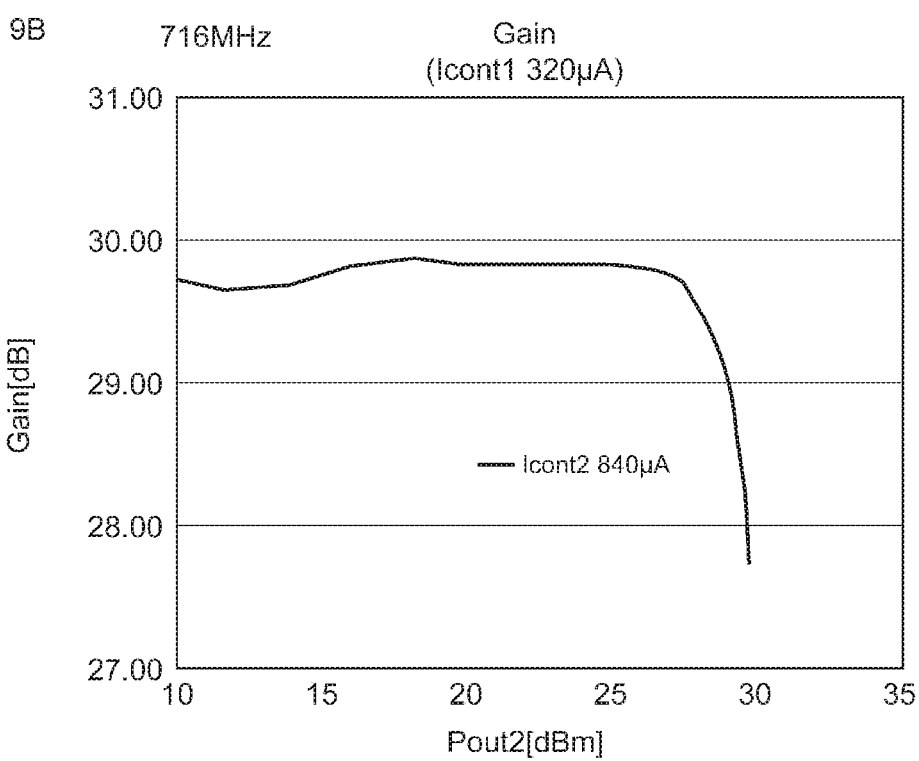

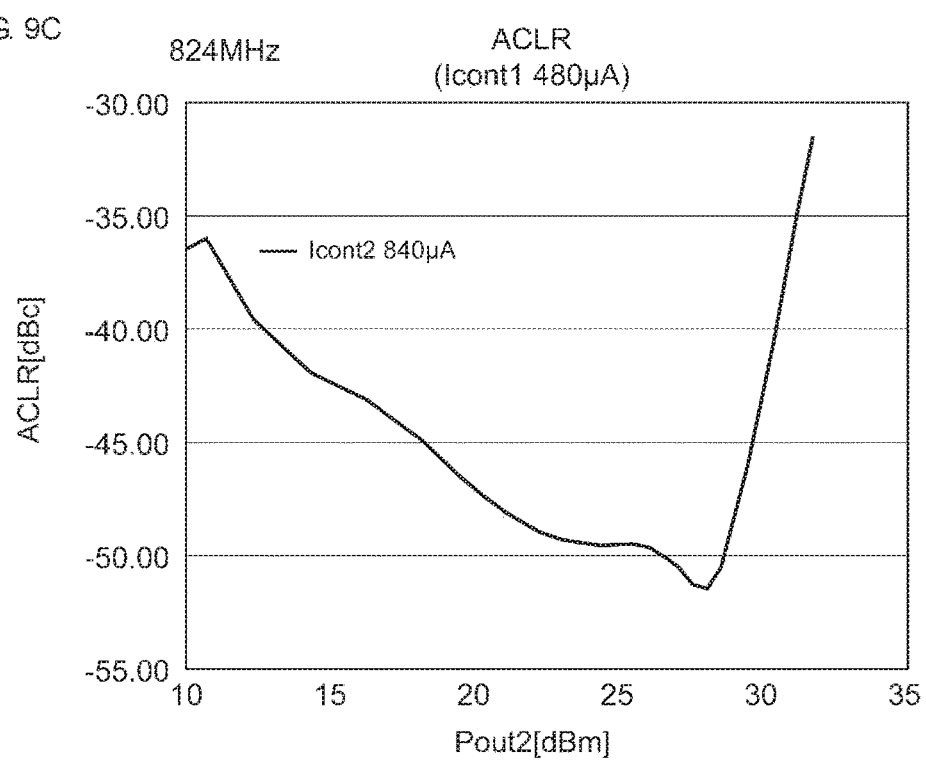

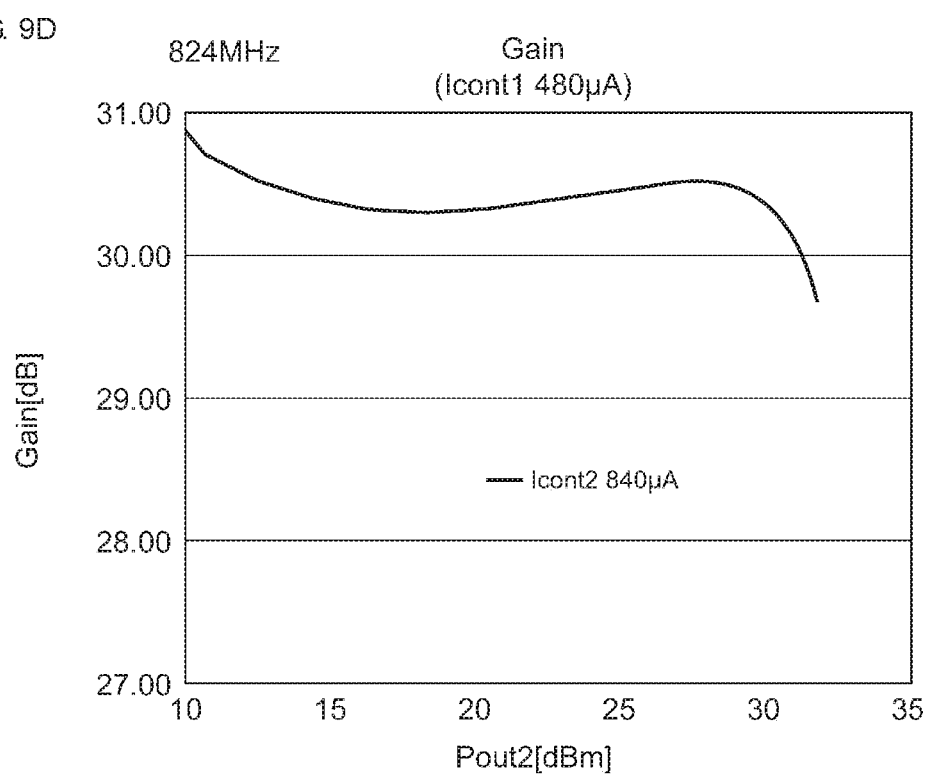

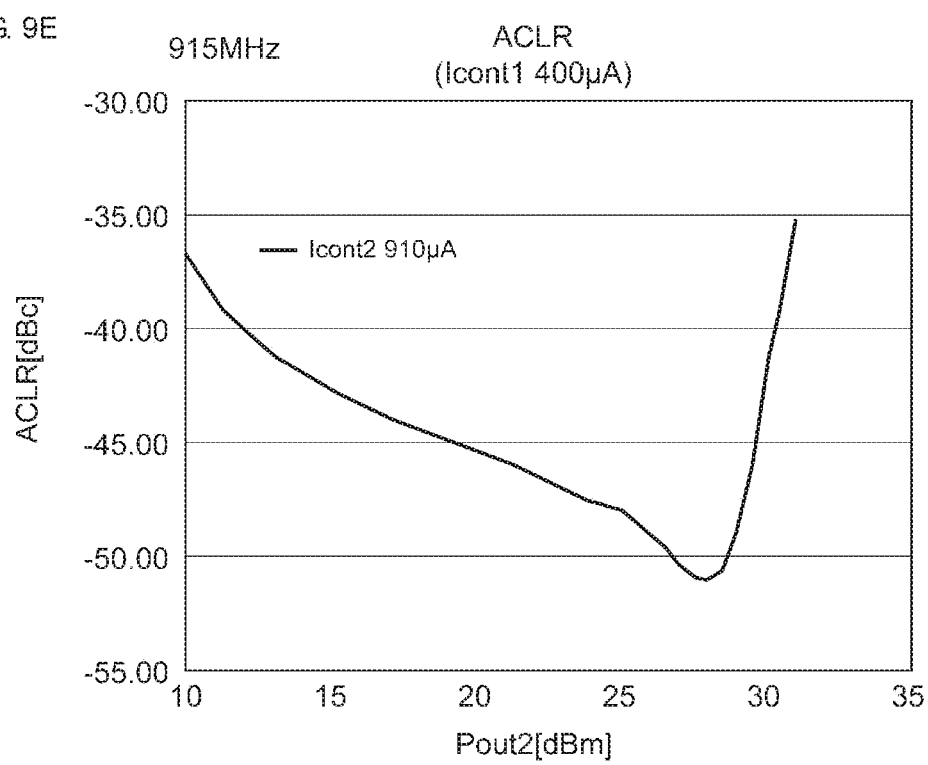

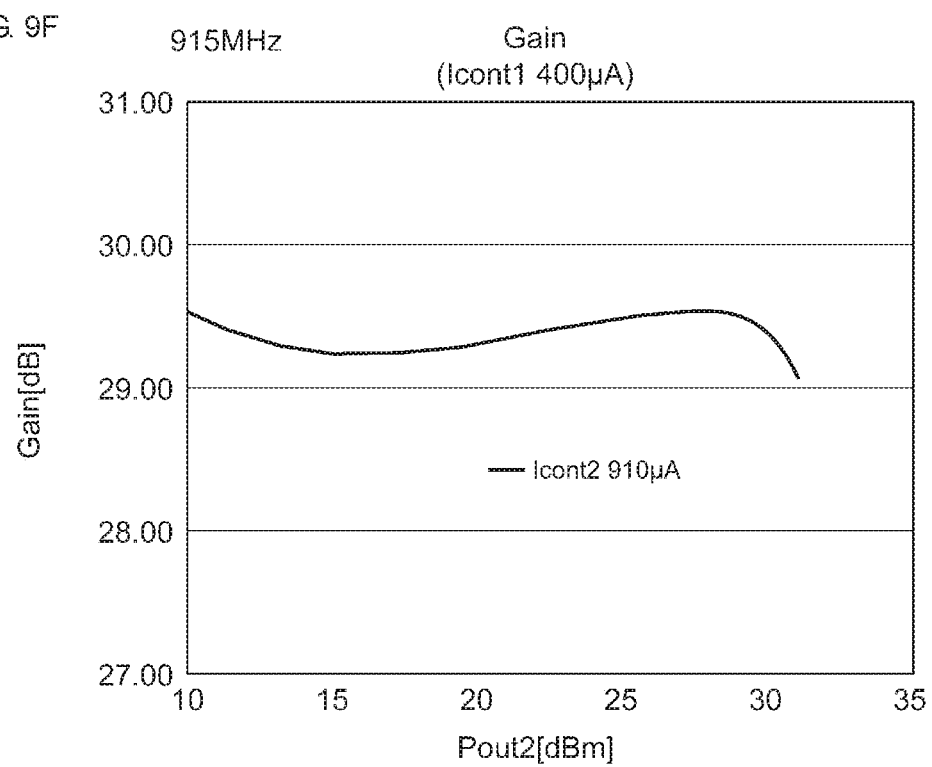

POWER AMPLIFICATION CIRCUIT

This application claims priority from Japanese Patent Application No. 2015-215771 filed on Nov. 2, 2015. The contents of this application is incorporated herein by reference in its entirety.

BACKGROUND

The present disclosure relates to a power amplification circuit.

It is known that distortion is generated in the output signal of a power amplification circuit that employs a transistor and it is generally required that the distortion of the output signal be suppressed over a wide range of output levels. With respect to this requirement, for example, International Publication No. 2009/125555 discloses a power amplification circuit that detects the amplitude of the envelope signal of an input signal by using a detection diode in a bias circuit and suppresses the size of the bias current to a greater extent as the amplitude of the envelope signal increases.

The distortion characteristics of the output signal are dependent on both the output level and the frequency, and although the distortion characteristics of the output signal are improved over a wide range of output levels in the circuit disclosed by International Publication No. 2009/125555, it is difficult to improve the distortion characteristics of the output signal over a wide range of frequencies.

BRIEF SUMMARY

The present disclosure was made in light of the above-described circumstances, and the present disclosure provides a power amplification circuit that includes a bias circuit that can improve the distortion characteristics of an output signal across a wide range of output levels and a wide range of frequencies.

A power amplification circuit according to an embodiment of the present disclosure includes: a first output transistor that has a power supply voltage supplied to a collector or a drain thereof, that has a common emitter or source, and that amplifies an input signal supplied to a base or gate thereof and outputs a first amplified signal from the collector or the drain thereof; a first transistor that has the power supply voltage supplied to a collector or a drain thereof, that has a first current supplied to a base or a gate thereof and that supplies a first bias current to the base or gate of the first output transistor from an emitter or a source thereof; and a second transistor that has a collector or a drain thereof connected to the base or gate of the first transistor, that has a second current supplied to a base or gate thereof and that supplies a second bias current to the base or gate of the first output transistor from an emitter or source thereof; where the size of at least either of the first current and the second current can be adjusted.

According to the embodiment of the present disclosure, there can be provided a power amplification circuit that includes a bias circuit that can improve the distortion characteristics of an output signal across a wide range of output levels and a wide range of frequencies.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIG. 7A is a graph illustrating simulation results of ACLR characteristics of the power amplification circuit according to the first embodiment of the present disclosure and a comparative example;

FIG. 7B is a graph illustrating simulation results of gain characteristics of the power amplification circuit according to the first embodiment of the present disclosure and the comparative example;

FIG. 8C is a graph illustrating simulation results of ACLR characteristics of the power amplification circuit according to the fourth embodiment of the present disclosure;

FIG. 9A is a graph illustrating simulation results of ACLR characteristics of the power amplification circuit according to the fourth embodiment of the present disclosure;

FIG. 9B is a graph illustrating simulation results of gain characteristics of the power amplification circuit according to the fourth embodiment of the present disclosure;

FIG. 9C is a graph illustrating simulation results of ACLR characteristics of the power amplification circuit according to the fourth embodiment of the present disclosure;

FIG. 9D is a graph illustrating simulation results of gain characteristics of the power amplification circuit according to the fourth embodiment of the present disclosure;

FIG. 9E is a graph illustrating simulation results of ACLR characteristics of the power amplification circuit according to the fourth embodiment of the present disclosure; and FIG. 9F is a graph illustrating simulation results of gain characteristics of the power amplification circuit according to the fourth embodiment of the present disclosure.

DETAILED DESCRIPTION

Figure 1:
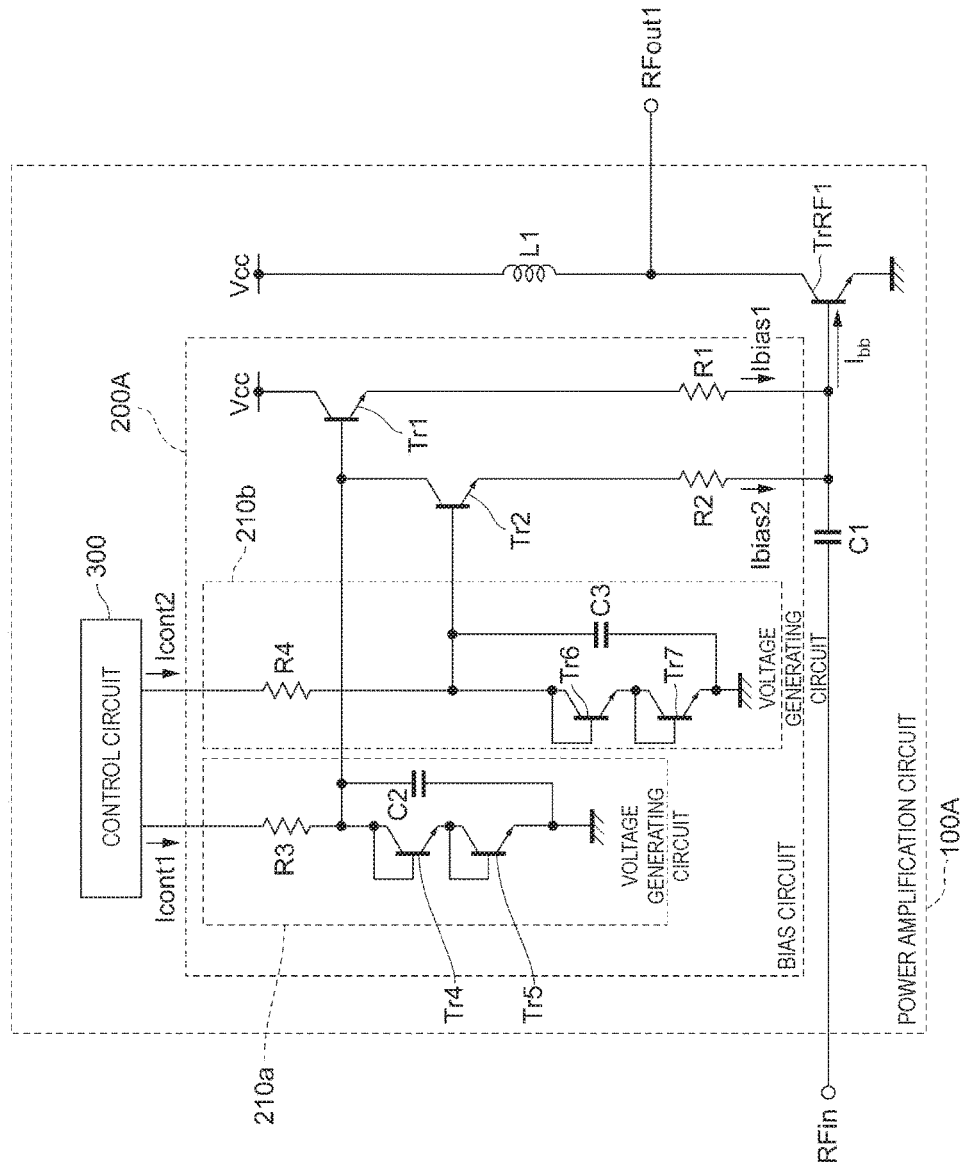
FIG. 1 is a circuit diagram of a power amplification circuit according to a first embodiment of the present disclosure.

Hereafter, embodiments of the present disclosure will be described in detail while referring to the drawings. In addition, elements that are the same as each other will be denoted by the same symbols and repeated description thereof will be omitted.

First Embodiment

FIG. 1 illustrates an example configuration of a power amplification circuit 100A, which is an embodiment of the present disclosure.

The power amplification circuit 100A amplifies a radio frequency (RF) signal RFin (input signal) and outputs an amplified signal RFout1 (first amplified signal).

As illustrated in FIG. 1, the power amplification circuit 100A includes a bias circuit 200A, a control circuit 300, a capacitance element C1, an inductor L1 and a bipolar transistor TrFR1.

The bias circuit 200A generates a bias current Ibias1 (first bias current) and a bias current Ibias2 (second bias current) and supplies the bias currents Ibias1 and Ibias2 to the base of the bipolar transistor TrFR1. The details of the configuration of the bias circuit 200A will be described later.

The control circuit 300 generates prescribed currents and supplies the currents to the bias circuit 200A. Specifically, the control circuit 300 supplies a control current Icont1 (first control current) and a control current Icont2 (second control current) to the bias circuit 200A and controls the sizes of the bias currents Ibias1 and Ibias2. The control currents Icont1 and Icont2 can be individually controlled.

The RF signal RFin is supplied from outside the power amplification circuit 100A to a first terminal of the capacitance element C1 and a second terminal of the capacitance element C1 is connected to the base of the bipolar transistor TrFR1. The capacitance element C1 removes a direct current component of the RF signal RFin.

A power supply voltage Vcc is supplied to a first terminal of the inductor L1 and a second terminal of the inductor L1 is connected to the collector of the bipolar transistor TrRF1.

The power supply voltage Vcc is supplied to the collector of the bipolar transistor TrFR1 (first output transistor) via the inductor L1, the base of the bipolar transistor TrFR1 is connected to the second terminal of the capacitance element C1 and the bipolar transistor TrFR1 has a common-emitter configuration. The RF signal RFin, which is supplied from outside the power amplification circuit 100A, and the bias currents Ibias1 and Ibias2, which are output from the bias circuit 200A, are supplied to the base of the bipolar transistor TrFR1. As a result, the amplified signal RFout1, which is obtained by amplifying the RF signal RFin, is output from the collector of the bipolar transistor TrRF1. The gain characteristics of the bipolar transistor TrFR1 are controlled in accordance with the bias currents supplied from the bias circuit 200A.

Next, the method employed by the bias circuit 200A to generate the bias currents will be described.

The bias circuit 200A includes voltage generating circuits 210 (210a and 210b), resistance elements R1 and R2 and bipolar transistors Tr1 and Tr2.

The voltage generating circuits 210 (210a and 210b) generate voltages of prescribed levels on the basis of the control currents Icont1 and Icont2 supplied from the control circuit 300.

Specifically, the voltage generating circuit 210a (first voltage generating circuit) includes a resistance element R3, bipolar transistors Tr4 and Tr5, and a capacitance element C2, for example. The control current Icont1 is supplied to a first terminal of the resistance element R3 (first resistance element) and a second terminal of the resistance element R3 is connected to the collector of the bipolar transistor Tr4. The bipolar transistor Tr4 (fourth transistor) is diode-connected, the collector thereof is connected to the second terminal of the resistance element R3 and the emitter thereof is connected to the collector of the bipolar transistor Tr5. The bipolar transistor Tr5 (fifth transistor) is diode-connected, the collector thereof is connected to the emitter of the bipolar transistor Tr4 and the bipolar transistor Tr5 has a common-emitter configuration. A first terminal of the capacitance element C2 is connected to the second terminal of the resistance element R3 and to the collector of the bipolar transistor Tr4 and the second terminal of the capacitance element C2 is grounded.

Furthermore, the voltage generating circuit 210b (second voltage generating circuit) includes a resistance element R4 (second resistance element), a bipolar transistor Tr6 (sixth transistor), a bipolar transistor Tr7 (seventh transistor) and a capacitance element C3, for example. The configuration of the voltage generating circuit 210b is the same as that of the voltage generating circuit 210a and therefore detailed description thereof will be omitted.

With the above-described configuration, a voltage of a prescribed level (first voltage) (for example, around 2.6 V) is generated at the collector of the bipolar transistor Tr4 by the two diode-connected bipolar transistors Tr4 and Tr5 in the voltage generating circuit 210a. A voltage of a prescribed level (second voltage) (for example, around 2.6 V) is generated at the collector of the bipolar transistor Tr6 by the two diode-connected bipolar transistors Tr6 and Tr7 in the voltage generating circuit 210b.

The power supply voltage Vcc is supplied to the collector of the bipolar transistor Tr1 (first transistor), the base of the bipolar transistor Tr1 is connected to the collector of the bipolar transistor Tr4 and the emitter of the bipolar transistor Tr1 is connected to a first terminal of the resistance element R1. A current supplied to the base of the bipolar transistor Tr1 (first current) is controlled by the control current Icont1 supplied from the control circuit 300.

The collector of the bipolar transistor Tr2 (second transistor) is connected to the base of the bipolar transistor Tr1, the base of the bipolar transistor Tr2 is connected to the collector of the bipolar transistor Tr6, and the emitter of the bipolar transistor Tr2 is connected to a first terminal of the resistance element R2. A current supplied to the base of the bipolar transistor Tr2 (second current) is controlled by the control current Icont2 supplied from the control circuit 300.

The first terminals of the resistance elements R1 and R2 are respectively connected to the emitters of the bipolar transistors Tr1 and Tr2 and second terminals of the resistance elements R1 and R2 are connected to the base of the bipolar transistor TrFR1.

With the above-described configuration, the bias circuit 200A generates the bias currents Ibias1 and Ibias2 and supplies the generated bias currents Ibias1 and Ibias2 to the base of the bipolar transistor TrFR1.

Hereafter, the operation and effect of switching between the bias current Ibias1 and the bias current Ibias2 as the bias current supply source will be described in detail.

The values of the bias currents Ibias1 and Ibias2 vary depending on an output power Pout1 of the bipolar transistor TrFR1. This will be explained below.

When the output power Pout1 of the bipolar transistor TrFR1 is small (when the signal level of the RF signal is small), the size of a base current Ibb of the bipolar transistor TrFR1 is small. In this case, since the size of the bias current required by the bipolar transistor TrFR1 is small, the bias current Ibias2 that flows through the bipolar transistor Tr2 is the dominant bias current supply source. This is because, when the bipolar transistor Tr2 causes a current to flow therethrough, the base current of the bipolar transistor Tr1 is drawn out and the base current of the bipolar transistor Tr1 falls.

On the other hand, when the output power Pout1 of the bipolar transistor TrFR1 is large (when the signal level of the RF signal is large), the size of the base current Ibb of the bipolar transistor TrFR1 is large. Since the bipolar transistor TrFR1 requires a larger bias current in this case, the bias current Ibias1 is also supplied from the bipolar transistor Tr1. At this time, when the bipolar transistor Tr1 causes a current to flow therethrough, the collector current of the bipolar transistor Tr2 falls by an amount equal to the size of the base current of the bipolar transistor Tr1 (base current=Ibias1÷hFE, where hFE denotes the current amplification factor of the bipolar transistor Tr1). Therefore, the bias current Ibias1 rises and the bias current Ibias2 falls. In other words, when the base current Ibb of the bipolar transistor TrFR1 exceeds a prescribed level, the bias current Ibias1, which flows through the bipolar transistor Tr1, becomes the dominant bias current supply source. The sizes of the bias currents Ibias1 and Ibias2 can be adjusted by controlling the sizes of the control currents Icont1 and Icont2.

Next, the description will focus on an output impedance Z* of the bias circuit 200A seen from the base terminal of the bipolar transistor TrFR1 in the power amplification circuit 100A. Z1 represents the output impedance of a path that passes through the bipolar transistor Tr1, and Z2 represents the output impedance of a path that passes through the bipolar transistor Tr2. Z1 and Z2 are expressed by the following Expressions (1) and (2), where k represents the Boltzmann constant, T represents the absolute temperature, q represents an elementary electrical charge, r1 and r2 respectively represent the resistance values of the resistance elements R1 and R2, hFE represents the current amplification factor of the bipolar transistor Tr1 and Z' represents the output impedance on the control circuit 300 side as seen from the base terminal of the bipolar transistor Tr1.

$$Z1 = \frac{kT}{q}\frac{1}{Ibias1} + \frac{Z'}{1+hFE} + r1 \quad (1)$$

$$Z2 = \frac{kT}{q}\frac{1}{Ibias2} + Z' + r2 \quad (2)$$

Therefore, Z* is expressed by the following Expression (3).

$$Z^* = Z1 // Z2 = \left(\frac{kT}{q}\frac{1}{Ibias1} + \frac{Z'}{1+hFE} + r1\right) // \left(\frac{kT}{q}\frac{1}{Ibias2} + Z' + r2\right) \quad (3)$$

The bias current Ibias2 is the dominant bias current supply source when the size of the base current Ibb is small as described above, and the value of the bias current Ibias1 in the first term on the right side of Expression (1) is small. Therefore, Z1 has a very large value on the whole and Z*≈Z2 according to Expression (3). Here, if we compare Z2 and the output impedance Z1 of the bias circuit in the case where the bipolar transistor Tr2 is not provided, Z2 has a value that is larger than Z1 by an amount obtained when Z' is not divided by (1+hFE) in the second term on the right side of Expression (2). Therefore, in the case where the value of the base current Ibb is low, the output impedance Z* of the entire bias circuit 200A is higher than in the case where the bipolar transistor Tr2 is not provided.

On the other hand, in the case where the size of the base current Ibb is large, the value of the bias current Ibias2 in the first term on the right side of Expression (2) is small and therefore the value of Z2 is very large. Therefore, Z*≈Z1 according to Expression (3) and the output impedance Z* of the entire bias circuit 200A has substantially the same value as in the case where the bipolar transistor Tr2 is not provided.

In other words, the output impedance Z* of the entire bias circuit 200A in the region where the output power Pout1 of the bipolar transistor TrFR1 is small is higher than that of a circuit that is not provided with the bipolar transistor Tr2. Conversely, the output impedance Z* of the entire bias circuit 200A in the region where the output power Pout1 of the bipolar transistor TrFR1 is large has substantially the same value as that of a circuit that is not provided with the bipolar transistor Tr2. Thus, the output impedance Z* of the entire bias circuit 200A changes by a large amount compared with a circuit that is not provided with the bipolar transistor Tr2. Therefore, in the power amplification circuit 100A, the sizes of the bias currents Ibias1 and Ibias2 can be adjusted and the output impedance Z* can be made to change by controlling the control currents Icont1 and Icont2.

Here, the value of Ibb×Z* increases when the value of the base current Ibb of the bipolar transistor TrFR1 increases with an increase in the output power Pout1 of the bipolar transistor TrFR1. Thus, the base voltage of the bipolar transistor TrFR1 falls by an amount equal to Ibb×Z*, and consequently it is not possible to obtain the ideal gain. That is, when the bipolar transistor TrFR1 exceeds a power value Pcomp at a prescribed output level, a phenomenon occurs in which the gain falls (gain compression) and degradation of the gain characteristics occurs. Degradation of the gain characteristics refers to a situation in which, rather than being constant over a wide range of output levels, which would be ideal, the gain is not constant over a wide range of output levels.

When the output power Pout1 increases further, the RF amplitude at the emitter terminal of the bipolar transistor Tr1 increases together with an increase in the amplitude of the RF signal RFin. On the other hand, the RF amplitude at the base terminal of the bipolar transistor Tr1, which depends on the amplitude of the RF signal RFin, is small. That is, in the bipolar transistor Tr1, the change in the emitter voltage is large but the change in the base voltage is small.

Therefore, in the case where the emitter voltage of the bipolar transistor Tr1 increases together with the amplitude of the RF signal RFin, the difference between the emitter voltage and the base voltage of the bipolar transistor Tr1 decreases and the bipolar transistor Tr1 enters an off state. On the other hand, in the case where the emitter voltage of the bipolar transistor Tr1 decreases together with the amplitude of the RF signal RFin, the difference between the emitter voltage and the base voltage of the bipolar transistor Tr1 increases, the bipolar transistor Tr1 enters an on state and a decrease in the emitter voltage is suppressed. Thus, the average value of the emitter voltage of the bipolar transistor Tr1 increases due to the bipolar transistor Tr1 switching between the on state and the off state.

Thus, a phenomenon in which the base voltage of the bipolar transistor TrFR1 increases and the gain becomes higher than an ideal value (gain expansion) occurs. In other words, when the output power Pout1 of the bipolar transistor TrFR1 exceeds a power value Pexp, which is at a higher output level than the power value Pcomp that is at a prescribed output level, gain expansion occurs and the gain characteristics are degraded.

Regarding gain compression and gain expansion, the power value Pcomp at which gain compression starts can be adjusted by controlling the above-described output impedance Z* in the power amplification circuit 100A. Hereafter, a specific method of adjusting the power values Pcomp and Pexp will be described while referring to FIG. 2.

Figure 2:
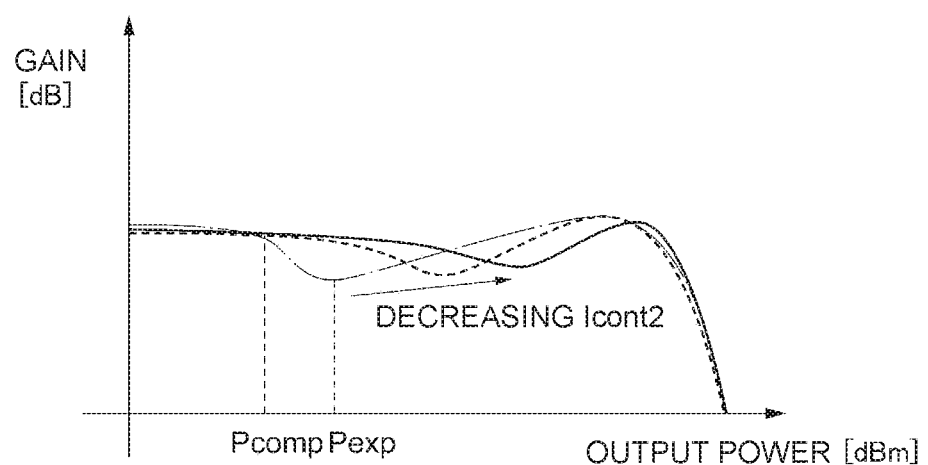
FIG. 2 is a graph illustrating an image of the gain characteristics of the power amplification circuit according to the first embodiment of the present disclosure.

FIG. 2 is a graph illustrating an image of the relationship between the output power Pout1 of the bipolar transistor TrFR1 and the gain characteristics. Here, as an example of control of the output impedance Z*, the size of the control current Icont2 is adjusted. As illustrated in FIG. 2, when the size of the control current Icont2 is increased, the output impedance Z* increases and the power value Pcomp at which gain compression starts becomes smaller. Conversely, when the size of the control current Icont2 is decreased, the output impedance Z* falls and the power value Pcomp at which gain compression starts becomes larger. Thus, by adjusting the control current Icont2 so as to make the power value Pcomp where gain compression starts to occur be close to the power value Pexp where gain expansion starts to occur, degradation of the gain characteristics that occurs with variations of the output power Pout1 can be suppressed.

Furthermore, although the gain characteristics depend upon the frequency, in the power amplification circuit 100A, the control currents Icont1 and Icont2 can be independently controlled in the control circuit 300 in accordance with the frequency of the RF signal RFin. Therefore, degradation of the gain characteristics can be reduced for the RF signal RFin across a wide frequency band.

Second Embodiment

Figure 3:
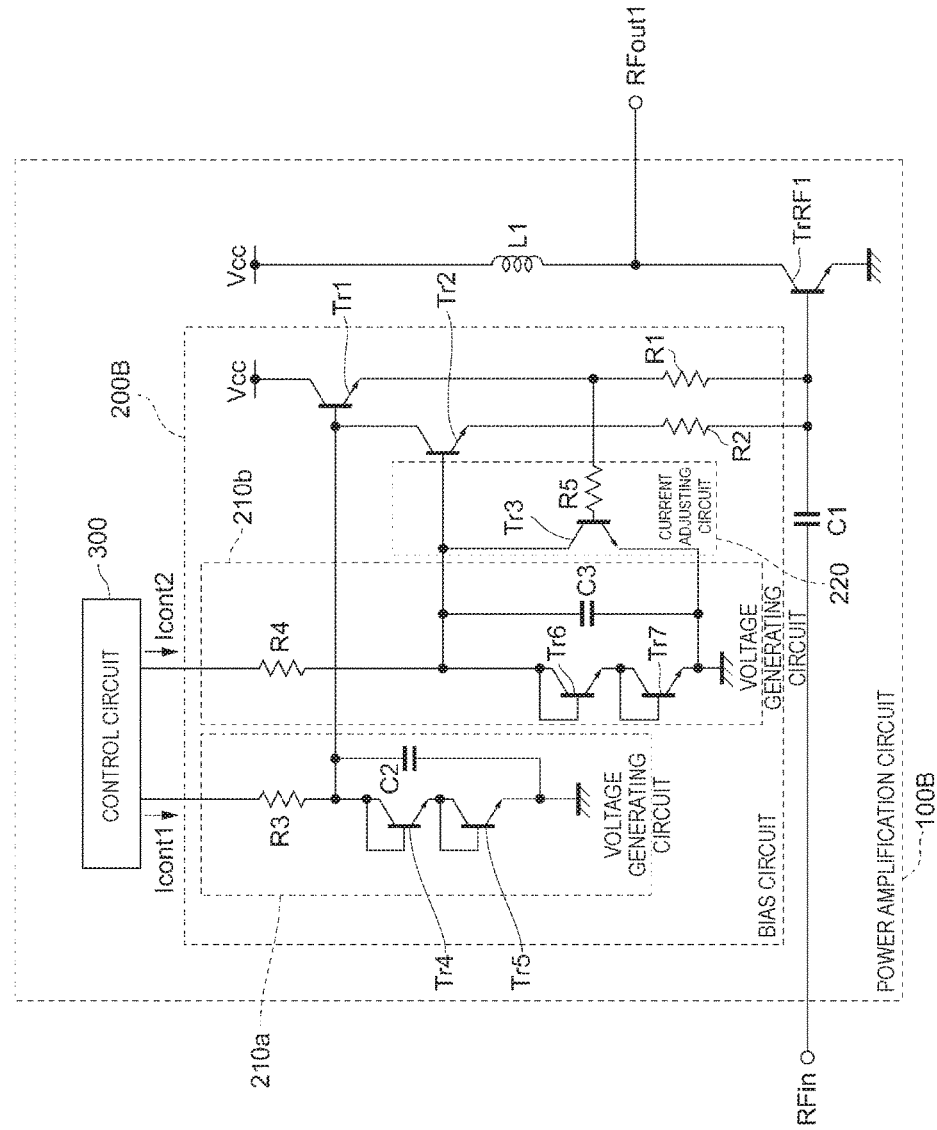
FIG. 3 is a circuit diagram of a power amplification circuit according to a second embodiment of the present disclosure.

FIG. 3 illustrates a power amplification circuit 100B, which is an example of the power amplification circuit 100. Elements that are the same as those of the power amplification circuit 100A are denoted by the same symbols and description thereof is omitted. The power amplification circuit 100B includes a bias circuit 200B instead of the bias circuit 200A of the power amplification circuit 100A.

The bias circuit 200B differs from the bias circuit 200A illustrated in FIG. 1 in that the bias circuit 200B further includes a current adjusting circuit 220.

The current adjusting circuit 220 includes a bipolar transistor Tr3 and a resistance element R5.

The collector of the bipolar transistor Tr3 (third transistor) is connected to the base of the bipolar transistor Tr2, the base of the bipolar transistor Tr3 is connected to a first terminal of the resistance element R5 and the bipolar transistor Tr3 has a common emitter configuration.

The first terminal of the resistance element R5 is connected to the base of the bipolar transistor Tr3 and a second terminal of the resistance element R5 is connected to the emitter of the bipolar transistor Tr1.

In the bias circuit 200B, the current adjusting circuit 220 adjusts the size of the base current of the bipolar transistor Tr2 in accordance with the size of the bias current Ibias1 that flows through the bipolar transistor Tr1. Specifically, when the bias current Ibias1 exceeds a prescribed level, the bipolar transistor Tr3 enters an on state and draws the base current of the bipolar transistor Tr2 out. Therefore, the size of the bias current Ibias2 that flows through the bipolar transistor Tr2 falls and consequently the level of the output signal when the main supply source of the bias current is switched to the bipolar transistor Tr1 from the bipolar transistor Tr2 (state changes from Ibias1<Ibias2 to Ibias1>Ibias2) can be reduced.

Third Embodiment

Figure 4:
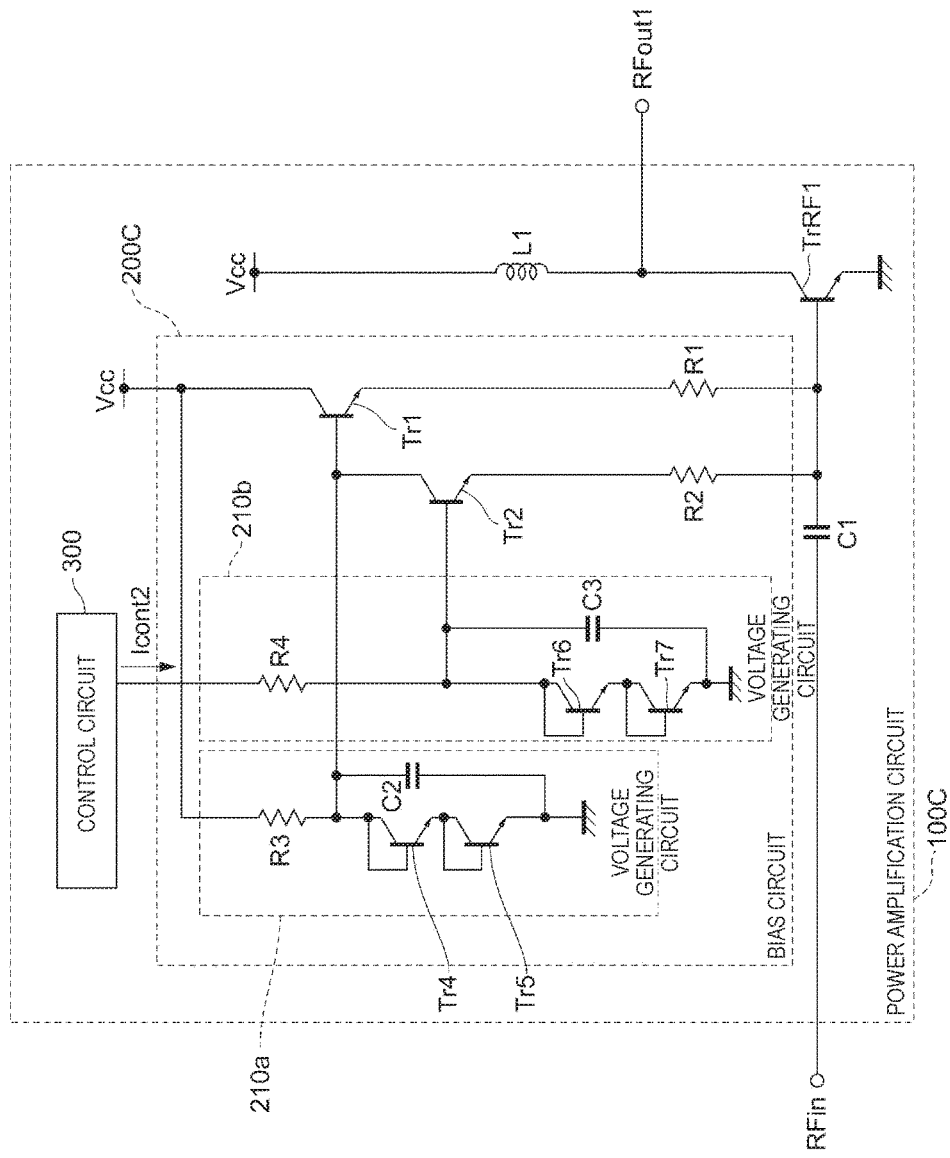
FIG. 4 is a circuit diagram of a power amplification circuit according to a third embodiment of the present disclosure.

FIG. 4 illustrates a power amplification circuit 100C, which is an example of the power amplification circuit 100.

Elements that are the same as those of the power amplification circuit 100A are denoted by the same symbols and description thereof is omitted. The power amplification circuit 100C includes a bias circuit 200C instead of the bias circuit 200A of the power amplification circuit 100A.

The bias circuit 200C differs from the bias circuit 200A illustrated in FIG. 1 in that the power supply voltage Vcc (first control voltage) is supplied to the input terminal of the voltage generating circuit 210a (first terminal of resistance element R3) instead of the control current Icont1. With this configuration, the voltage generating circuit 210a is driven by the power supply voltage Vcc and therefore the number of terminals can be reduced compared with the bias circuit 200A. Therefore, the power amplification circuit 100C is able to achieve the same effect as the power amplification circuit 100A while achieving a reduction in the chip size compared with the power amplification circuit 100A.

Furthermore, a configuration may also be adopted in which the power supply voltage Vcc (second control voltage) is supplied to the input terminal (first terminal of resistance element R4) of the voltage generating circuit 210b instead of the voltage generating circuit 210a and the control current Icont1 is supplied to the input terminal (first terminal of resistance element R3) of the voltage generating circuit 210a.

In addition, a similar configuration to that of the embodiment illustrated in FIG. 4 may also be adopted in a case where the current adjusting circuit 220 is provided, as in the power amplification circuit 100B illustrated in FIG. 3.

Fourth Embodiment

Figure 5:
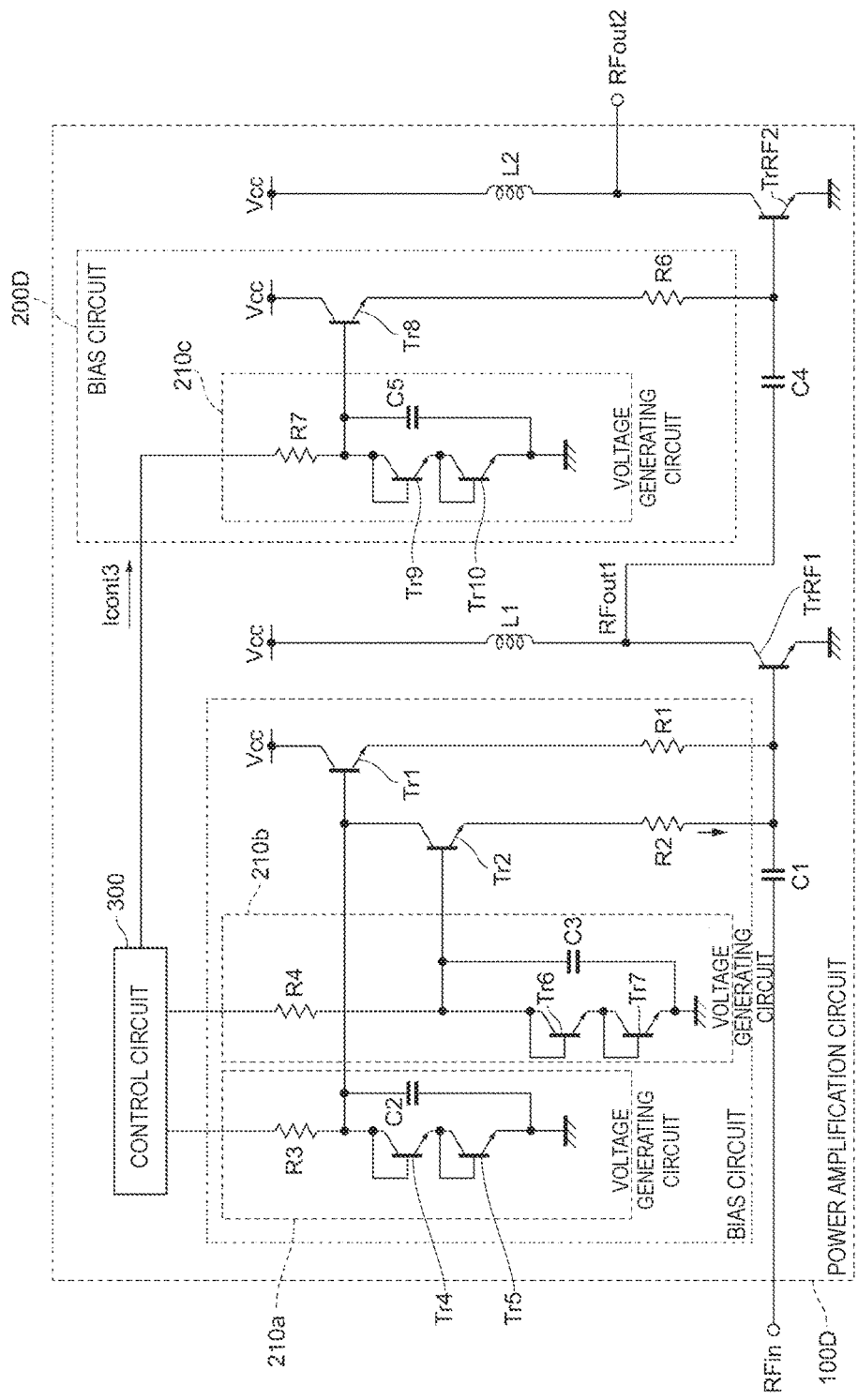
FIG. 5 is a circuit diagram of a power amplification circuit according to a fourth embodiment of the present disclosure.

FIG. 5 illustrates a power amplification circuit 100D, which is an example of the power amplification circuit 100. Elements that are the same as those of the power amplification circuit 100A are denoted by the same symbols and description thereof is omitted.

The power amplification circuit 100D differs from the power amplification circuit 100A illustrated in FIG. 1 in that the power amplification circuit 100D is a multistage amplification circuit formed of two amplifiers.

Specifically, as illustrated in FIG. 5, in addition to the constituent components of the power amplification circuit 100A, the power amplification circuit 100D further includes a bias circuit 200D, a capacitance element C4, an inductor L2 and a bipolar transistor TrRF2.

The bias circuit 200D includes a voltage generating circuit 210c, a resistance element R6 and a bipolar transistor Tr8.

The voltage generating circuit 210c includes a resistance element R7, bipolar transistors Tr9 and Tr10 and a capacitance element C5, for example. The configuration of the voltage generating circuit 210c is the same as that of the voltage generating circuit 210a and therefore detailed description thereof will be omitted.

A first terminal of the resistance element R6 is connected to the emitter of the bipolar transistor Tr8 and a second terminal of the resistance element R6 is connected to the base of the bipolar transistor TrRF2.

The power supply voltage Vcc is supplied to the collector of the bipolar transistor Tr8, the base of the bipolar transistor Tr8 is connected to a second terminal of the resistance element R7 and to the collector of the bipolar transistor Tr9, and the emitter of the bipolar transistor Tr8 is connected to the first terminal of the resistance element R6. A control current Icont3, which is supplied from the control circuit 300, and a voltage output from the voltage generating circuit 210c are supplied to the base of the bipolar transistor Tr8. Thus, a bias current is output from the emitter of the bipolar transistor Tr8.

As a result of having the above-described configuration, the bias circuit 200D supplies a bias current to the base of the bipolar transistor TrRF2.

The amplified signal RFout1, which is obtained through amplification by the collector of the bipolar transistor TrFR1, is supplied to a first terminal of the capacitance element C4 and a second terminal of the capacitance element C4 is connected to the base of the bipolar transistor TrRF2. The capacitance element C4 removes a direct current component of the amplified signal RFout1.

The power supply voltage Vcc is supplied to a first terminal of the inductor L2 and a second terminal of the inductor L2 is connected to the collector of the bipolar transistor TrRF2.

The power supply voltage Vcc is supplied to the collector of the bipolar transistor TrFR2 (second output transistor) via the inductor L2, the base of the bipolar transistor TrFR2 is connected to the second terminal of the capacitance element C4 and the bipolar transistor TrFR2 has a common-emitter configuration. The amplified signal RFout1 and the bias current, which is output from the bias circuit 200D, are supplied to the base of the bipolar transistor TrRF2. Thus, an amplified signal RFout2 (second amplified signal), which is obtained by further amplifying the amplified signal RFout1, is output from the collector of the bipolar transistor TrRF2. In other words, the power amplification circuit 100D is a circuit that has a higher amplification factor, when the circuit is viewed as a whole, than the power amplification circuits 100A to 100C.

Next, the method used to reduce degradation of the gain characteristics in the power amplification circuit 100D will be described while referring to FIG. 6.

Figure 6:
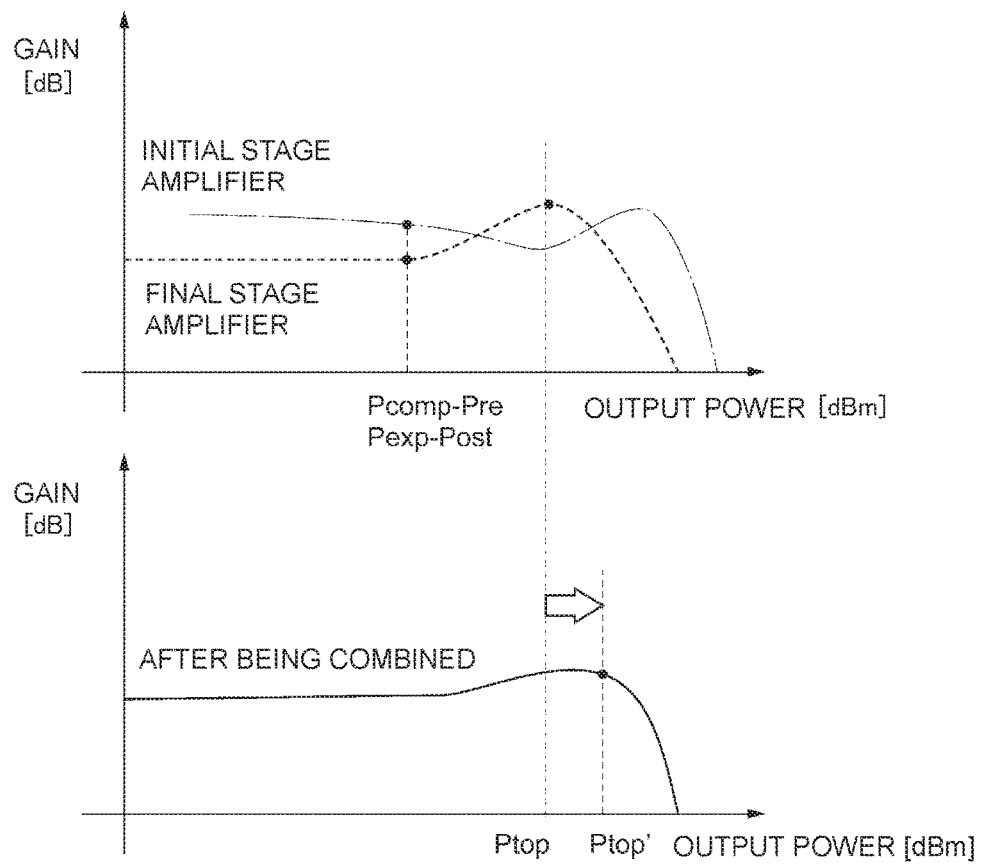
FIG. 6 is a graph illustrating an image of the gain characteristics of the power amplification circuit according to the fourth embodiment of the present disclosure.

The graph in the upper part of FIG. 6 illustrates an image of the relationship between output power and gain characteristics for the bipolar transistor TrFR1 (initial stage amplifier) and the bipolar transistor TrRF2 (final stage amplifier) of the power amplification circuit 100D. As illustrated in the upper part of FIG. 6, in the gain characteristics of the final stage amplifier, which includes the bias circuit 200D that does not include the bipolar transistor Tr2, gain expansion occurs when the output power exceeds a prescribed output power value and after that gain compression occurs.

Here, for the initial stage amplifier, the power value Pcomp, which is at the output level where gain compression starts, can be adjusted by the bias circuit 200A, as illustrated in FIG. 2. Therefore, by adjusting the power value Pcomp such that the gain characteristics of the initial stage amplifier become gain characteristics that are opposite to those of the final stage amplifier, degradation of characteristics in the initial stage amplifier and the final stage amplifier can cancel each other out and degradation of gain characteristics across the entire multistage amplifier can be reduced.

Specifically, as illustrated in the upper part of FIG. 6, it is possible to make a power value Pcomp_Pre at which gain compression starts in the initial stage amplifier be close to a power value Pexp_Post at which gain expansion starts in the final stage amplifier. As a result, as illustrated in the lower part of FIG. 6, when the gain characteristics of the initial stage amplifier and the gain characteristics of the final stage amplifier are combined, the gain expansion generated in the final stage amplifier is canceled out by the gain compression generated in the initial stage amplifier and the linearity of the gain characteristics is improved. Therefore, compared with the power amplification circuit 100A, the power amplification circuit 100D is able to reduce degradation of gain characteristics across the entire multistage amplifier while securing a higher amplification factor.

Furthermore, as illustrated in the lower part of FIG. 6, compared to the final stage amplifier that does not use the bias circuit 200A, a power value Ptop that is at an output level where the transition between gain compression and gain expansion occurs can be shifted to a power value Ptop', which is higher than the power value Ptop, in the combined gain characteristics. In other words, compared with a multistage amplifier that does not include the bias circuit 200A, the power amplification circuit 100D can reduce degradation of the gain characteristics for the RF signal RFin across a wider range of power values.

In addition, similarly to as in the power amplification circuit 100A, since the control currents Icont1 to Icont3 can be independently controlled by the control circuit 300, degradation of gain characteristics can be reduced for the RF signal RFin over a wide frequency band.

Furthermore, a similar configuration to that of the embodiment illustrated in FIG. 5 may also be adopted in a case where the current adjusting circuit 220 is provided as in the power amplification circuit 100B illustrated in FIG. 3 and in a case where the power supply voltage Vcc is supplied to the input terminal of the voltage generating circuit 210a or 210b as in the power amplification circuit 100C illustrated in FIG. 4.

In addition, the amplifier is not limited to having two stages and may instead have three or more stages.

Furthermore, although the bias current is supplied by the bias circuit 200A of the initial stage amplifier in this embodiment, the amplifier in which the bias circuit 200A supplies the bias current is not limited to being the initial stage amplifier and may be any of the amplifiers.

Simulation Results

Next, simulation results for the adjacent channel leakage ratio (ACLR) and gain characteristics of the power amplification circuits 100A and 100D will be described while referring to FIGS. 7A and 7B and FIGS. 9A to 9F.

FIGS. 7A and 7B are graphs that respectively illustrate simulation results for the ACLR characteristics and the gain characteristics of the power amplification circuit 100A according to the first embodiment of the present disclosure and a comparative example. The comparative example is a power amplification circuit that includes the bias circuit 200D instead of the bias circuit 200A among the constituent elements of the power amplification circuit 100A. The vertical axis of the graph illustrated in FIG. 7A represents ACLR (dBc), the vertical axis of the graph illustrated in FIG. 7B represents gain (dB) and the horizontal axes in both graphs represent output power Pout1 (dBm) of the amplified signal RFout1. FIGS. 7A and 7B illustrate simulation results obtained when the frequency of the RF signal RFin is 824 MHz, the control current Icont1 is 200 μA and the control current Icont2 is 10 μA.

Regarding the ACLR characteristics of the power amplification circuit 100A, it is clear that the ACLR is lower and that distortion of the output signal, which is the amplified signal RFout1, is reduced with the power amplification circuit 100A compared with the comparative example, particularly in a range of output power Pout1 of 17 dBm to 29 dBm, as illustrated in FIG. 7A.

In addition, it is clear that the gain expansion is suppressed compared with the comparative example in the gain characteristics and that the linearity of the gain characteristics is improved, particularly in a range of the output power Pout1 of over 20 dBm, as illustrated in FIG. 7B.

Next, simulation results for the power amplification circuit 100D according to the fourth embodiment of the present disclosure, which is a multistage amplification circuit, will be described.

Figure 8A:
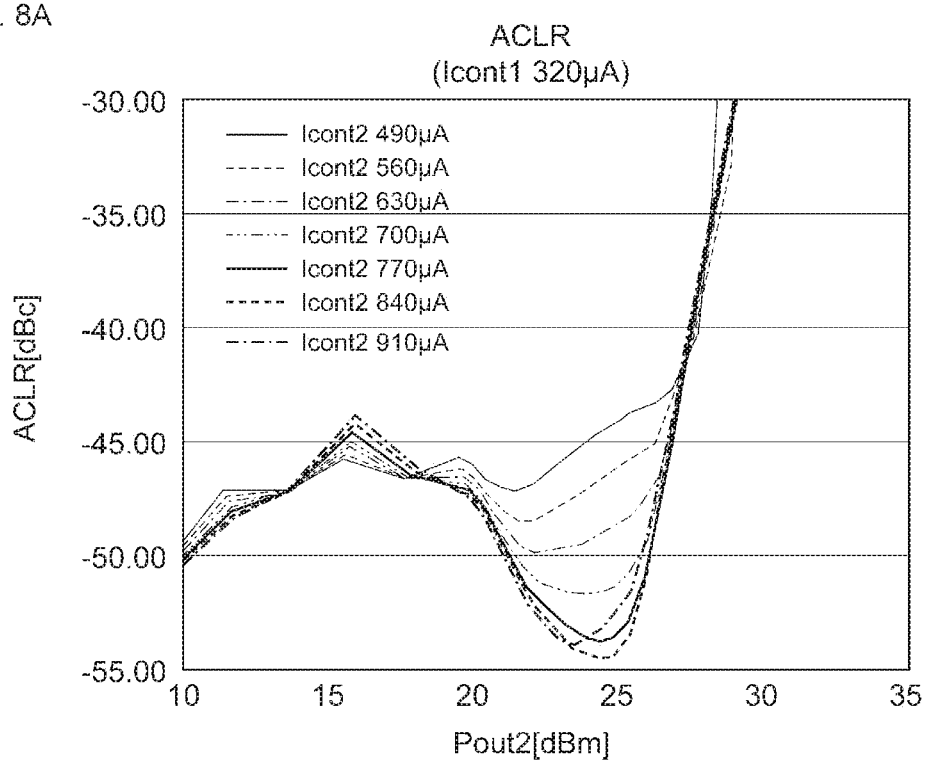
FIG. 8A is a graph illustrating simulation results of ACLR characteristics of the power amplification circuit according to the fourth embodiment of the present disclosure.
Figure 8B:
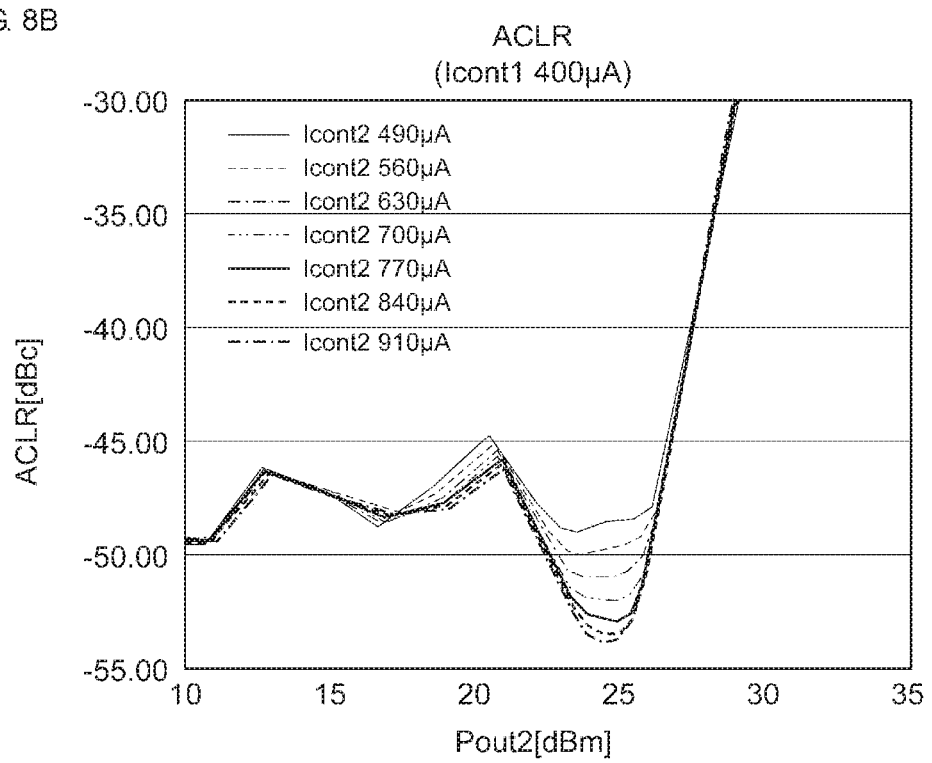
FIG. 8B is a graph illustrating simulation results of ACLR characteristics of the power amplification circuit according to the fourth embodiment of the present disclosure.
Figure 8D:
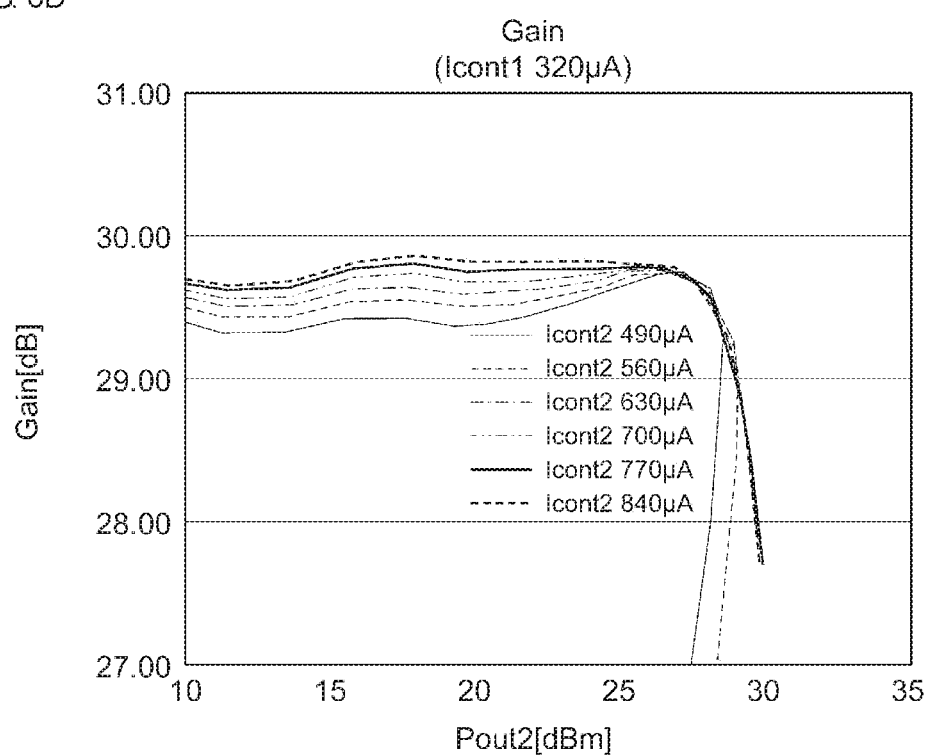
FIG. 8D is a graph illustrating simulation results of gain characteristics of the power amplification circuit according to the fourth embodiment of the present disclosure.
Figure 8E:
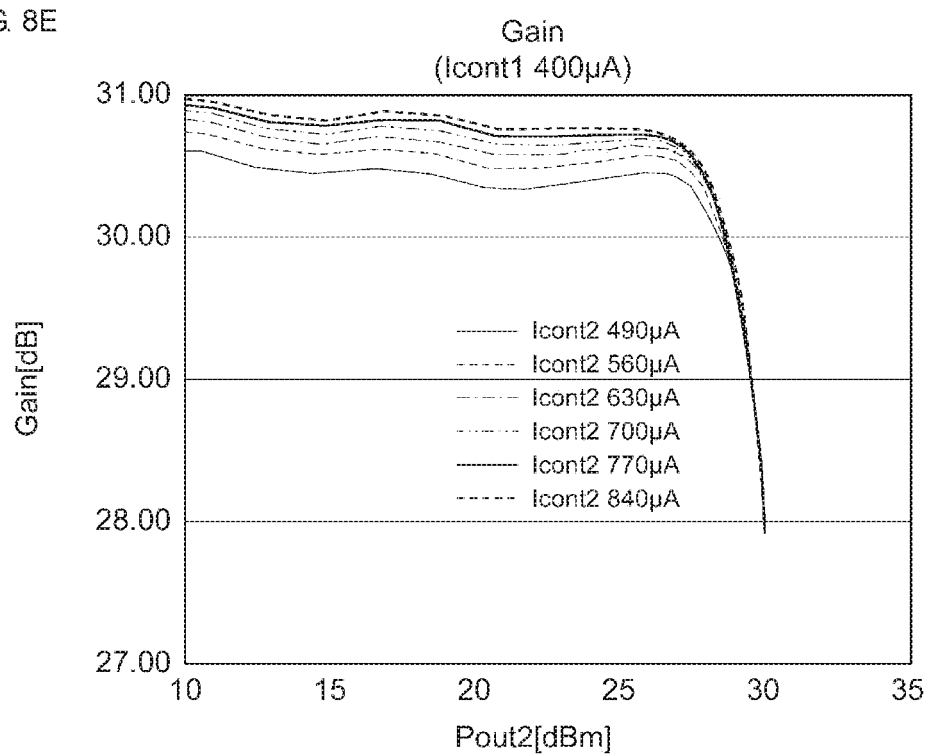
FIG. 8E is a graph illustrating simulation results of gain characteristics of the power amplification circuit according to the fourth embodiment of the present disclosure.
Figure 8F:
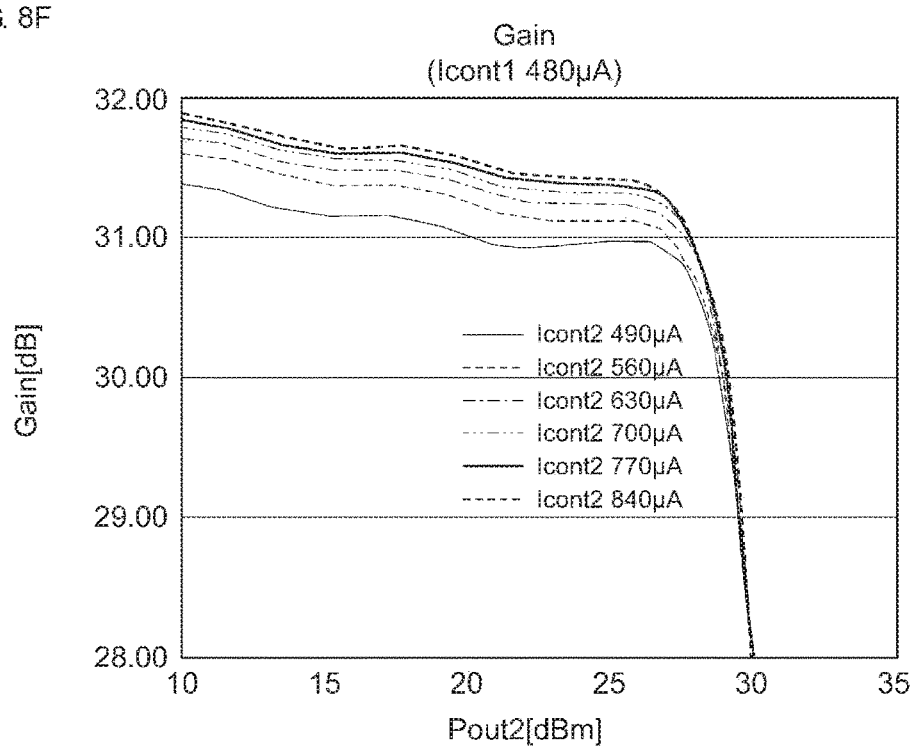
FIG. 8F is a graph illustrating simulation results of gain characteristics of the power amplification circuit according to the fourth embodiment of the present disclosure.

FIGS. 8A to 8F are graphs illustrating simulations results for the ACLR characteristics and the gain characteristics of the power amplification circuit 100D for cases where the control currents Icont1 and Icont2 are changed to various values. The vertical axes of the graphs illustrated in FIGS. 8A to 8C represent ACLR (dBc), the vertical axes of the graphs illustrated in FIG. 8D to 8F represent gain (dB) and the horizontal axes in all the graphs represent output power Pout2 (dBm) of the amplified signal RFout2. FIGS. 8A to 8F illustrate results obtained for an RF signal RFin having a frequency of 716 MHz when the control currents Icont1 and Icont2 are changed to various values (Icont1=(320 µA, 400 µA, 480 µA) and Icont2=(490 µA, 560 µA, 630 µA, 700 µA, 770 µA, 840 µA, 910 µA (FIGS. 8A to 8C))).

As illustrated in FIGS. 8A to 8F, it is clear that the ACLR characteristics and the gain characteristics change with the sizes of the control currents Icont1 and Icont2. Comparing FIGS. 8A to 8C, ACLR has the smallest value when the power Pout2 is around 25 dBm when (Icont1, Icont2)=(320 µA, 840 µA) (FIG. 8A). In addition, comparing FIGS. 8D to 8F, the gain is highest and the linearity is maintained across a wide range of power Pout2 when (Icont1, Icont2)=(320 µA, 840 µA) (FIG. 8D). Therefore, for an RF signal RFin having a frequency of 716 MHz, it is clear that distortion of an output signal that is the amplified signal RFout2 can be greatly reduced by making the control currents be (Icont1, Icont2)=(320 µA, 840 µA), for example.

Next, suitable combinations of control currents for RF signals RFin having different frequencies will be described while referring to FIGS. 9A to 9F.

FIGS. 9A to 9F are graphs illustrating simulation results obtained for cases where the sizes of the control currents Icont1 and Icont2 are set to suitable values in the power amplification circuit 100D when the frequency of the RF signal RFin is 716 MHz, 824 MHz and 915 MHz. The vertical axes of the graphs illustrated in FIGS. 9A, 9C and 9E represent ACLR (dBc), the vertical axes of the graphs illustrated in FIGS. 9B, 9D and 9F represent gain (dB) and the horizontal axes in all the graphs represent output power Pout2 (dBm) of the amplified signal RFout2.

As illustrated in FIGS. 9A to 9F, suitable combinations of the control currents Icont1 and Icont2 set in accordance with the frequency of the RF signal RFin are (frequency: Icont1, Icont2)=(716 MHz: 320 µA, 840 µA), (824 MHz: 480 µA, 840 µA), (915 MHz: 400 µA, 910 µA). That is, the suitable combination of the control currents Icont1 and Icont2 changes with the frequency of the RF signal RFin.

In the above-described simulation results, it is illustrated that distortion of the output signal, which is the amplified signal RFout2, is reduced by independently controlling the control currents Icont1 and Icont2 in the power amplification circuit 100D in accordance with the frequency of the RF signal RFin.

Exemplary embodiments of the present disclosure have been described above. The power amplification circuits 100A to 100D are provided with the bipolar transistor Tr2 in a bias circuit thereof and as a result the output impedance Z* of the bias circuit seen from the base terminal of the bipolar transistor TrFR1 is increased and the output impedance Z* can be adjusted by adjusting the control currents Icont1 to Icont3. Consequently, the regions in which gain compression and gain expansion occur in the output power can be adjusted in the gain characteristics of the bipolar transistor TrFR1 and distortion of the output signals that are the amplified signals RFout1 and RFout2 can be reduced across a wide range of output power. In addition, the control currents Icont1 to Icont3 can be suitably adjusted in accordance with the frequency of the RF signal RFin. Therefore, distortion of the output signals that are the amplified signals RFout1 and RFout2 can be reduced for an RF signal across a wide frequency band.

Furthermore, the power amplification circuit 100B includes the current adjusting circuit 220 that adjusts the size of the base current of the bipolar transistor Tr2 in accordance with the size of the bias current Ibias1 that flows through the bipolar transistor Tr1. Thus, compared with the power amplification circuit 100A, the level of the output signal when the supply source of the bias current is switched from the bipolar transistor Tr2 to the bipolar transistor Tr1 can be made smaller.

Furthermore, the power amplification circuit 100C drives the voltage generating circuit 210a or 210b by using the power supply voltage Vcc instead of the control circuit 300. Thus, compared with the power amplification circuit 100A, the same effect as with the power amplification circuit 100A can be achieved with a smaller chip size.

Furthermore, the power amplification circuit 100D is a multistage amplification circuit that includes two amplifiers. The power amplification circuit 100D further amplifies the amplified signal RFout1, which is produced by the initial stage amplifier, with the final stage amplifier and outputs the amplified signal RFout2. By applying the bias circuit 200A to the initial stage amplifier of the power amplification circuit 100D, the gain characteristics of the initial stage amplifier can be adjusted to be opposite to the gain characteristics of the final stage amplifier. As a result, degradation of characteristics in the initial and final stage amplifiers cancel each other out and degradation of the gain characteristics of the circuit as a whole can be reduced.

Furthermore, the power amplification circuits 100A to 100D include the control circuit 300 that adjusts the sizes of the control currents Icont1 to Icont3 in accordance with the frequency of the RF signal RFin. As a result, the base current of the bipolar transistor Tr1 or the bipolar transistor Tr2 can be adjusted in accordance with the frequency of the RF signal RFin.

MOSFETs may be used instead of the bipolar transistors of the power amplification circuits illustrated in FIGS. 1 and 3 to 5.

The purpose of the embodiments described above is to enable easy understanding of the present disclosure and the embodiments are not to be interpreted as limiting the present disclosure. The present disclosure can be modified or improved without departing from the gist of the disclosure and equivalents to the present disclosure are also included in the present disclosure. In other words, appropriate design changes made to the embodiments by a person skilled in the art are included in the scope of the present disclosure so long as the changes have the characteristics of the present disclosure. For example, the elements included in the embodiments and the arrangements, materials, conditions, shapes, sizes and so forth of the elements are not limited to those exemplified in the embodiments and can be appropriately changed. In addition, the elements included in the embodiments can be combined as much as technically possible and such combined elements are also included in the scope of the present disclosure so long as the combined elements have the characteristics of the present disclosure.

While embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplification circuit comprising:
a first output transistor wherein a power supply voltage is supplied to a collector or a drain of the first output transistor, the first output transistor has a common emitter or source, and an input signal supplied to a base or gate of the first output transistor is amplified and output as a first amplified signal from the collector or drain of the first output transistor;
a first transistor wherein the power supply voltage is supplied to a collector or a drain of the first transistor, a first current is supplied to a base or a gate of the first transistor, and a first bias current is supplied to the base or gate of the first output transistor from an emitter or a source of the first transistor; and
a second transistor wherein a collector or a drain of the second transistor is connected to the base or gate of the first transistor, a second current is supplied to a base or gate of the second transistor, and a second bias current is supplied to the base or gate of the first output transistor from an emitter or source of the second transistor; and
a reactance element connected between the emitter or the source of the first transistor, and the base or the gate of the first output transistor,
wherein the first current or the second current can be adjusted.

2. The power amplification circuit according to claim 1, further comprising:
a current adjusting circuit that draws out a current corresponding to the first bias current from the base or gate of the second transistor.

3. A power amplification circuit comprising:
a first output transistor wherein a power supply voltage is supplied to a collector or a drain of the first output transistor, the first output transistor has a common emitter or source, and an input signal supplied to a base or gate of the first output transistor is amplified and output as a first amplified signal from the collector or drain of the first output transistor;
a first transistor wherein the power supply voltage is supplied to a collector or a drain of the first transistor, a first current is supplied to a base or a gate of the first transistor, and a first bias current is supplied to the base or gate of the first output transistor from an emitter or a source of the first transistor;
a second transistor wherein a collector or a drain of the second transistor is connected to the base or gate of the first transistor, a second current is supplied to a base or gate of the second transistor, and a second bias current is supplied to the base or gate of the first output transistor from an emitter or source of the second transistor; and
a current adjusting circuit that draws out a current corresponding to the first bias current from the base or gate of the second transistor, wherein:
the first current or the second current can be adjusted, and
the current adjusting circuit includes a third transistor, wherein a collector or a drain of the third transistor is connected to the base or gate of the second transistor, a base or gate of the third transistor is connected to the emitter or source of the first transistor, and the third transistor has a common emitter or source.

4. The power amplification circuit according to claim 1, further comprising:
a first voltage generating circuit that supplies a first voltage of a prescribed level to the base or gate of the first transistor; and
a second voltage generating circuit that supplies a second voltage of a prescribed level to the base or gate of the second transistor.

5. A power amplification circuit comprising:
a first output transistor wherein a power supply voltage is supplied to a collector or a drain of the first output transistor, the first output transistor has a common emitter or source, and an input signal supplied to a base or gate of the first output transistor is amplified and output as a first amplified signal from the collector or drain of the first output transistor;
a first transistor wherein the power supply voltage is supplied to a collector or a drain of the first transistor, a first current is supplied to a base or a gate of the first transistor, and a first bias current is supplied to the base or gate of the first output transistor from an emitter or a source of the first transistor;
a second transistor wherein a collector or a drain of the second transistor is connected to the base or gate of the first transistor, a second current is supplied to a base or gate of the second transistor, and a second bias current is supplied to the base or gate of the first output transistor from an emitter or source of the second transistor;
a first voltage generating circuit that supplies a first voltage of a prescribed level to the base or gate of the first transistor; and
a second voltage generating circuit that supplies a second voltage of a prescribed level to the base or gate of the second transistor, wherein:
the first current or the second current can be adjusted,
the first voltage generating circuit includes:
a first resistance element wherein a first control current or a first control voltage supplied to a first end of the first resistance element,
a fourth transistor wherein a collector or a drain of the fourth transistor is connected to a second end of the first resistance element, and a base or a gate of the fourth transistor is connected to the collector or drain of the fourth transistor, and
a fifth transistor wherein a collector or a drain of the fifth transistor is connected to the emitter or source of the fourth transistor, a base or a gate of the fifth transistor is connected to the collector or drain of the fifth transistor, and the fifth transistor has a common emitter or source,
the second voltage generating circuit includes:
a second resistance element that has a second control current or a second control voltage supplied to a first end of the second resistance element,
a sixth transistor wherein a collector or a drain of the sixth transistor is connected to a second end of the second resistance element, and a base or a gate of the sixth transistor is connected to the collector or drain of the sixth transistor, and
a seventh transistor wherein a collector or a drain of the seventh transistor is connected to the emitter or source of the sixth transistor, a base or a gate of the seventh transistor is connected to the collector or drain of the seventh transistor, and the seventh transistor has a common emitter or source, and the first voltage is output from the collector or drain of the fourth transistor and the second voltage is output from the collector or drain of the sixth transistor.

6. The power amplification circuit according to claim 4, wherein an input terminal of the first or second voltage generating circuit is connected to the power supply voltage.

7. The power amplification circuit according to claim 5, wherein an input terminal of the first or second voltage generating circuit is connected to the power supply voltage.

8. The power amplification circuit according to claim 1, further comprising:
a control circuit that adjusts the first or second current based on a frequency of the input signal.

9. The power amplification circuit according to claim 2, further comprising:
a control circuit that adjusts the first or second current based on a frequency of the input signal.

10. The power amplification circuit according to claim 3, further comprising:
a control circuit that adjusts the first or second current based on a frequency of the input signal.

11. The power amplification circuit according to claim 4, further comprising:
a control circuit that adjusts the first or second current based on a frequency of the input signal.

12. The power amplification circuit according to claim 5, further comprising:
a control circuit that adjusts the first or second current based on a frequency of the input signal.

13. The power amplification circuit according to a claim 1, further comprising:
a second output transistor that amplifies the first amplified signal and outputs a second amplified signal.

14. The power amplification circuit according to a claim 2, further comprising:
a second output transistor that amplifies the first amplified signal and outputs a second amplified signal.

15. The power amplification circuit according to a claim 3, further comprising:
a second output transistor that amplifies the first amplified signal and outputs a second amplified signal.

16. The power amplification circuit according to a claim 4, further comprising:
a second output transistor that amplifies the first amplified signal and outputs a second amplified signal.

17. The power amplification circuit according to a claim 5, further comprising:
a second output transistor that amplifies the first amplified signal and outputs a second amplified signal.

18. A power amplification circuit comprising:
a first output transistor wherein a power supply voltage is supplied to a collector or a drain of the first output transistor, the first output transistor has a common emitter or source, and an input signal supplied to a base or gate of the first output transistor is amplified and output as a first amplified signal from the collector or drain of the first output transistor;
a first transistor wherein the power supply voltage is supplied to a collector or a drain of the first transistor, a first current is supplied to a base or a gate of the first transistor, and a first bias current is supplied to the base or gate of the first output transistor from an emitter or a source of the first transistor; and
a second transistor wherein a collector or a drain of the second transistor is connected to the base or gate of the first transistor, a second current is supplied to a base or gate of the second transistor, and a second bias current is supplied to the base or gate of the first output transistor from an emitter or source of the second transistor;
a second output transistor that amplifies the first amplified signal and outputs a second amplified signal; and
an eighth transistor wherein the power supply voltage is supplied to a collector or a drain of the eighth transistor, a third current is supplied to a base or a gate of the eighth transistor, and a third bias current is supplied to the base or gate of the second output transistor from an emitter or a source of the eighth transistor, wherein:
the first current or the second current can be adjusted, and
the power supply voltage is supplied to a collector or a drain of the second output transistor, the second output transistor has a common emitter or source, and the first amplified signal supplied to a base or gate of the second output transistor is amplified and output from the collector or drain of the second output transistor.

19. The power amplification circuit according to claim 18, further comprising:
a third voltage generating circuit that supplies a third voltage of a prescribed level to the base or gate of the eighth transistor.

20. The power amplification circuit according to claim 19, wherein the third voltage generating circuit includes:
a seventh resistance element wherein a third control current or a third control voltage supplied to a first end of the first resistance element,
a ninth transistor wherein a collector or a drain of the ninth transistor is connected to a second end of the seventh resistance element, and a base or a gate of the ninth transistor is connected to the collector or drain of the eighth transistor, and
a tenth transistor wherein a collector or a drain of the tenth transistor is connected to the emitter or source of the ninth transistor, a base or a gate of the tenth transistor is connected to the collector or drain of the tenth transistor, and the tenth transistor has a common emitter or source, and
the third voltage is output from the collector or drain of the ninth transistor.

21. The power amplification circuit according to claim 1, wherein the reactance element is a resistor.

* * * * *

UNITED STATES PATENT AND TRADEMARK OFFICE
CERTIFICATE OF CORRECTION

PATENT NO. : 9,768,738 B2
APPLICATION NO. : 15/268815
DATED : September 19, 2017
INVENTOR(S) : Yuri Honda It is certified that error appears in the above-identified patent and that said Letters Patent is hereby corrected as shown below:

In the Specification

Column 4, Line 16, replace "Try" with -- Tr5 --.

Signed and Sealed this
Seventeenth Day of April, 2018

Andrei Iancu
*Director of the United States Patent and Trademark Office*